US012672580B2

(12) United States Patent
Park et al.

(10) Patent No.: US 12,672,580 B2
(45) Date of Patent: Jun. 30, 2026

(54) METHOD OF MANUFACTURING SEMICONDUCTOR PACKAGE USING DOUBLE ADHESIVE LAYERS

(71) Applicant: SK hynix Inc., Icheon-si (KR)

(72) Inventors: Mina Park, Icheon-si (KR); Minsuk Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 387 days.

(21) Appl. No.: 18/542,076

(22) Filed: Dec. 15, 2023

(65) Prior Publication Data

US 2025/0022830 A1      Jan. 16, 2025

(30) Foreign Application Priority Data

Jul. 11, 2023      (KR) ........................ 10-2023-0090094

(51) Int. Cl.
| | |
|---|---|
| *H10W 74/01* | (2026.01) |
| *H10P 72/70* | (2026.01) |
| *H10W 70/05* | (2026.01) |
| *H10W 70/09* | (2026.01) |
| *H10W 70/60* | (2026.01) |
| *H10W 70/652* | (2026.01) |
| *H10W 72/00* | (2026.01) |
| *H10W 72/50* | (2026.01) |
| *H10W 74/10* | (2026.01) |
| *H10W 90/00* | (2026.01) |

(52) U.S. Cl.
CPC ......... *H10W 74/019* (2026.01); *H10W 70/05* (2026.01); *H10W 90/00* (2026.01); *H10W 72/015* (2026.01); *H10W 90/732* (2026.01); *H10W 90/734* (2026.01)

(58) Field of Classification Search
CPC ..... H10W 70/05; H10W 70/09; H10W 70/60; H10W 74/019; H10W 74/014; H10W 74/117; H10W 74/16; H10W 90/00
See application file for complete search history.

(56) References Cited

U.S. PATENT DOCUMENTS

| | | | |
|---|---|---|---|
| 10,128,211 B2 | 11/2018 | Chang et al. | |
| 2006/0127627 A1* | 6/2006 | Larson .................... | E04D 5/142 156/289 |
| 2014/0130962 A1* | 5/2014 | Yu .......................... | H10P 10/128 156/247 |
| 2019/0051630 A1* | 2/2019 | Bayless ................... | H10P 72/74 |
| 2020/0043780 A1* | 2/2020 | Hwangbo .............. | H10H 20/01 |
| 2023/0140264 A1* | 5/2023 | Wei ........................... | B32B 7/12 156/332 |
| 2024/0061084 A1* | 2/2024 | Yu .......................... | G01S 7/4816 |

FOREIGN PATENT DOCUMENTS

| | | |
|---|---|---|
| KR | 101138793 B1 | 4/2012 |

* cited by examiner

*Primary Examiner* — Mohsen Ahmadi
(74) *Attorney, Agent, or Firm* — WILLIAM PARK AND ASSOCIATES LTD.

(57) ABSTRACT

First and second layers of different adhesive materials are laminated to a carrier such that the second adhesive layer is attached to the carrier. The first adhesive layer is cured first. A semiconductor die is then placed on the cured first adhesive layer. An encapsulant layer is formed over at least a portion of the cured first adhesive layer while encapsulating the first semiconductor die. The second adhesive layer is cured after which the carrier is separated from the cured second adhesive layer.

19 Claims, 14 Drawing Sheets

METHOD OF MANUFACTURING SEMICONDUCTOR PACKAGE USING DOUBLE ADHESIVE LAYERS

CROSS-REFERENCE TO RELATED APPLICATIONS

The present application claims priority under 35 U.S.C. 119 (a) to Korean Application No. 10-2023-0090094, filed on Jul. 11, 2023, in the Korean Intellectual Property Office, which is incorporated herein by reference in its entirety.

BACKGROUND

1. Technical Field

The present disclosure generally relates to a packaging technology and, more particularly, to a method of manufacturing a semiconductor package using different adhesive layers.

2. Related Art

Semiconductor packages are required to have a high integration density and high performance. They are also required to have a small form factor and be thin. Fan-out wafer level packages (FOWLPs) and a fan-in wafer level packages (FIWLPs) have been attempted as a wafer level package (WLP). A panel level package (PLP) in which a substrate is rectangular or panel-shaped instead of circular has also been attempted. In the wafer level package, a wafer supporting technology such as a wafer supporting system (WSS) may be required. A carrier may attach to a semiconductor die or wafer.

SUMMARY

According to an embodiment of the present disclosure, there may be provided a method of manufacturing a semiconductor package by laminating an adhesive sheet made of first and second adhesive layers, to a carrier such that the second adhesive layer is attached to the carrier. The first adhesive layer of the two-layer sheet is cured after the sheet is laminated to the carrier. A first semiconductor die is then positioned on the cured first adhesive layer. An encapsulant layer is formed over the cured first adhesive layer while encapsulating the first semiconductor die. Thereafter, the second adhesive layer is cured. The carrier is then separated from the cured second adhesive layer.

According to another embodiment of the present disclosure, there may be provided a method of manufacturing a semiconductor package comprising the ordered steps of: 1) forming or placing first and second adhesive layers on a carrier, 2) curing the first adhesive layer, 3) placing a first semiconductor die on the cured first adhesive layer, 4) forming an encapsulant layer coupled to a portion of the cured first adhesive layer while encapsulating the first semiconductor die, 5) curing the second adhesive layer, and 6) separating the carrier from the cured second adhesive layer.

BRIEF DESCRIPTION OF THE DRAWINGS

FIG. 7 is a cross-sectional view illustrating forming an encapsulant layer in the method of manufacturing a semiconductor package according to an embodiment of the present disclosure.

FIG. 8 is a cross-sectional view illustrating removing a portion of the encapsulant layer in the method of manufacturing a semiconductor package according to an embodiment of the present disclosure.

FIG. 9 is a cross-sectional view illustrating forming redistribution layers in the method of manufacturing a semiconductor package according to an embodiment of the present disclosure.

FIG. 10 is a cross-sectional view illustrating forming outer terminals in the method of manufacturing a semiconductor package according to an embodiment of the present disclosure.

FIG. 11 is a cross-sectional view illustrating second curing a second adhesive layer in the method of manufacturing a semiconductor package according to an embodiment of the present disclosure.

FIG. 12 is a cross-sectional view illustrating separating a carrier in the method of manufacturing a semiconductor package according to an embodiment of the present disclosure.

FIGS. 13 and 14 are cross-sectional views illustrating dicing a wafer into single semiconductor packages in the method of manufacturing a semiconductor package according to an embodiment of the present disclosure.

DETAILED DESCRIPTION

Figure 1:
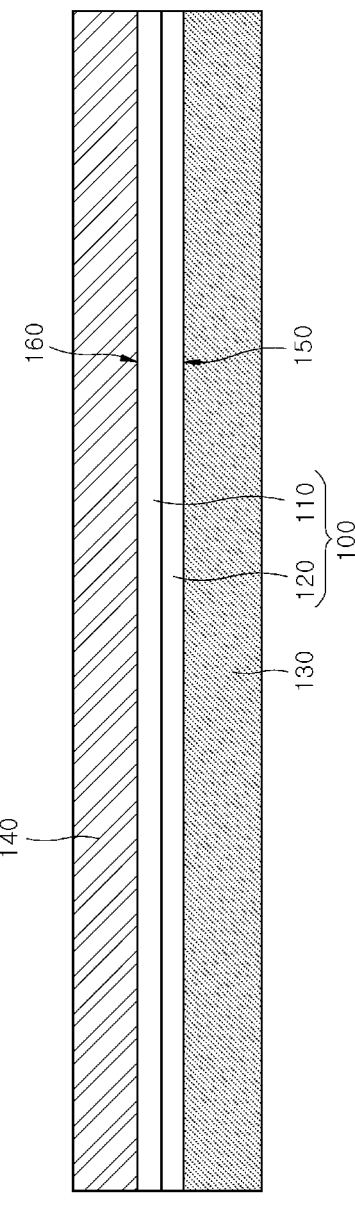
FIG. 1 is a cross-sectional view illustrating an adhesive sheet used in a method of manufacturing a semiconductor package according to an embodiment of the present disclosure.

The terms used herein may correspond to words selected in consideration of their functions in presented embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

In the description of the present disclosure, descriptions such as "first" and "second," "bottom," "top," "side," "surface" and "lower" are for distinguishing elements and are not used to limit the elements themselves or to imply a specific order. In the description of the present disclosure, descriptions such as "on" or "under or beneath" mean a relative positional relationship, but do not limit a specific case in which another member is further introduced into direct contact with the element or at an interface between them. The same interpretation can be applied to other expressions describing the relationship between components.

The same reference numbers throughout the specification may refer to the same elements. The same reference numerals or similar reference numerals may be described with reference to other drawings, even if not mentioned or described in the drawings. In addition, even if reference numerals are not indicated, description may be made with reference to other drawings.

FIGS. 1 to 14 are views illustrating a method of manufacturing a semiconductor package according to an embodiment of the present disclosure.

As used herein, the word "layer" may refer to a sheet of a material, which covers a surface or a body. As used herein, "laminate" means uniting or combining of two or more superposed layers to form a single structure.

FIG. 1 is a cross sectional view of an adhesive sheet 100 used in the method of manufacturing a semiconductor package according to an embodiment of the present disclosure. The adhesive sheet 100 may include a first adhesive layer 110 and a second adhesive layer 120, which are layers of adhesives that are made of different materials and which are cured differently. The adhesive layers 110 and 120 are thus adhesives, which are "different from each other." The first adhesive layer 110 and the second adhesive layer 120 are films, which may be laminated to each other, simply because of their mutual adhesion.

As shown in FIG. 1, a release layer 130 and a base layer 140 may be further laminated to the opposing surfaces 150 and 160 of the "adhesive" sheet 100. Each of the release layer 130 and the base layer 140 may be laminated to the bottom surface 150 and the top surface 160 of the adhesive sheet 100 as films or sheets.

The release layer 130 and the base layer 140 may be layers, films, or sheets that cover and protect opposite surfaces 150, 160 of the adhesive sheet 100. The base layer 140 may cover and protect the top surface 160 of the first adhesive layer 110. The release layer 130 may cover and protect the bottom surface 150 of the second adhesive layer 120.

The first adhesive layer 110 may have a thickness of several micrometers (μm) up to several tens of micrometers (μm). In the preferred embodiment, the first adhesive layer 110 may have a thickness of about 10 micrometers (μm).

The second adhesive layer 120 may also have a thickness of several micrometers (μm) to several tens of micrometers (μm). In the preferred embodiment, the second adhesive layer 120 may have a thickness of 10 micrometers (μm). The second adhesive layer 120 may thus have the same thickness as the first adhesive layer 110. The adhesive sheet 100 may therefore have a thickness of several tens of micrometers (μm). In the preferred embodiment, the adhesive sheet 100 may have a thickness of 20 micrometers (μm).

The first adhesive layer 110 may be a thermosetting adhesive, i.e., an adhesive which is cured by heat or thermal energy. The thermosetting adhesive may be a thermosetting resin, examples of which include epoxy resin and/or a phenol resin. The thermosetting adhesive may also be a crosslinking agent that induces a thermosetting reaction. The first adhesive layer 110 may further include a filler dispersed in the thermosetting adhesive. The filler may be composed of inorganic materials. The first adhesive layer 110 may further include a colorant additionally dispersed in the thermosetting adhesive. The colorant may improve the visibility of the first adhesive layer 110. The colorant may include carbon black or carbon powder. The first adhesive layer 110 may include an epoxy molding compound (EMC).

The second adhesive layer 120 may include an adhesive, which is cured by a method other than thermosetting. The second adhesive layer 120 may be an adhesive layer in which adhesive strength is reduced while the adhesive is cured by irradiation of light such as ultraviolet (UV) rays. The second adhesive layer 120 may thus be a photocurable adhesive layer containing a photocurable adhesive. The photocurable adhesive may be an adhesive that is cured by light. The photocurable adhesive may be an adhesive that is cured by ultraviolet (UV) rays. The photocurable adhesive may include a photopolymerizable compound. The photocurable adhesive may include an ultraviolet polymerizable compound. The photocurable adhesive may contain a compound having an ultraviolet curable functional group such as a carbon-carbon double bond and exhibiting adhesive properties. The photocurable adhesive may include an acrylic polymer. The photocurable adhesive may further include a photopolymerization initiator.

The second adhesive layer 120 may further include a filler in addition to the photocurable adhesive. The filler may be composed of an inorganic material. The second adhesive layer 120 may further include a colorant additionally dispersed in the photocurable adhesive. The colorant may improve the visibility of the second adhesive layer 120. The colorant may include carbon black or carbon powder.

Figure 2:
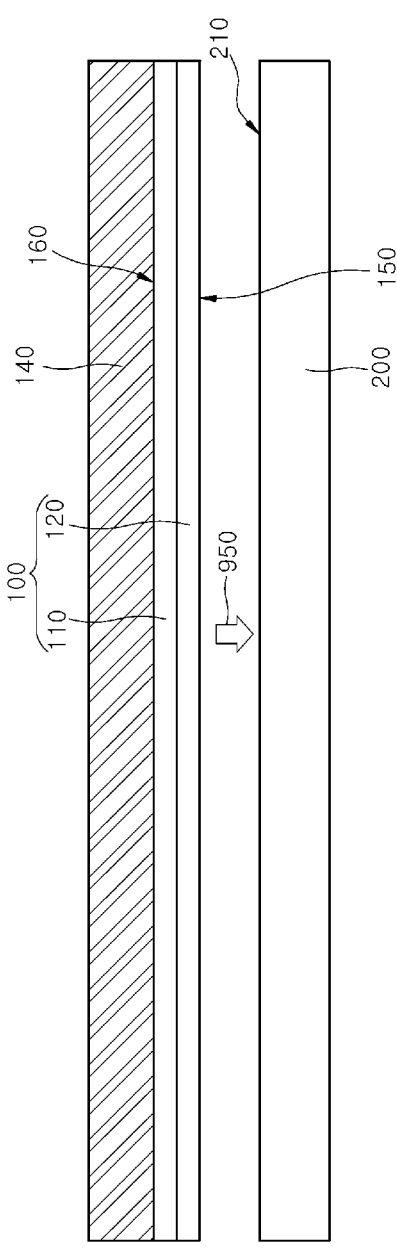
FIG. 2 is a cross-sectional view illustrating laminating an adhesive sheet to a carrier in the method of manufacturing a semiconductor package according to an embodiment of the present disclosure.

FIG. 2 illustrates laminating the adhesive sheet 100 to a carrier 200 in the method of manufacturing a semiconductor package according to an embodiment of the present disclosure.

Referring to FIGS. 1 and 2, the adhesive sheet 100 may be laminated 950 to the carrier 200. The release layer 130 (See FIG. 1) may be peeled off from the adhesive sheet 100 to expose the lower or bottom surface 150 of the second adhesive layer 120. The adhesive sheet 100 may be placed over the carrier 200 such that the exposed surface 150 of the second adhesive layer 120 faces a top or upper surface 210 of the carrier 200. The adhesive sheet 100 may be laminated 950 to the carrier 200. The adhesive sheet 100 may be laminated 950 to the carrier 200 such that the second adhesive layer 120 is mechanically bonded to the top surface 210 of the carrier 200. Thereafter, the base layer 140 may be peeled off from the adhesive sheet 100 such that the top surface 160 of the first adhesive layer 110 is exposed. In this way, the second adhesive layer 120 and the first adhesive layer 110 may be formed on the carrier 200.

The process steps for manufacturing the semiconductor package may be performed on the carrier 200. The carrier 200 may act as a worktable, a handling station, or a supporting substrate, which is detachable from the second adhesive layer 120. The carrier 200 may be made of a more rigid material than the adhesive sheet 100, such as a glass, silicon, or a metal. The carrier 200 may have a shape of a semiconductor wafer.

Figure 3:
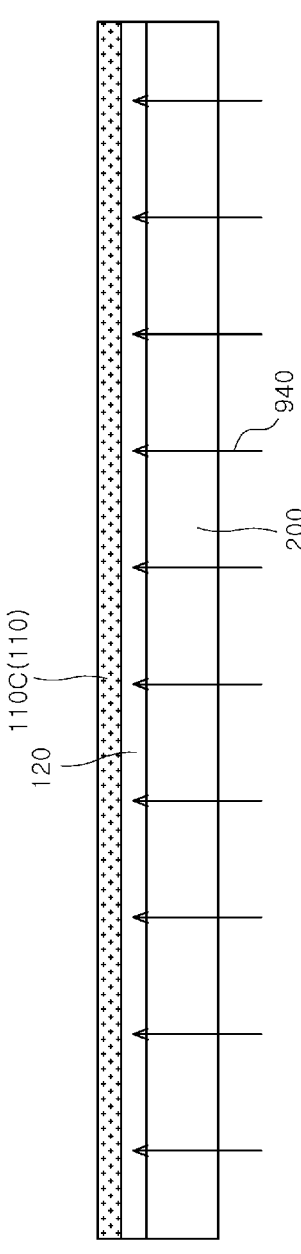
FIG. 3 is a cross-sectional view illustrating first curing a first adhesive layer in the method of manufacturing a semiconductor package according to an embodiment of the present disclosure.

FIG. 3 illustrates a "first" curing step, which is the curing of the first adhesive layer 110 in the method of manufacturing a semiconductor package according to an embodiment of the present disclosure.

Referring to FIG. 3, the first adhesive layer 110 may be "first cured," which, for claim construction purposes means that, the first adhesive layer 110, but not the second adhesive layer 120, is cured prior to when the second adhesive layer 120 is subjected to its own curing process. When the first adhesive layer 110 and the second adhesive layer 120 are both heated by thermal energy 940, the second adhesive layer 120, which is preferably cured by light, including UV, is not cured. Stated another way, the thermosetting adhesive first layer 110 and the photocurable adhesive second layer 120 are heated by the thermal energy 940, but only the thermosetting adhesive first layer 110 is selectively cured, i.e., the first layer 110 is "first cured" or cured first.

In FIG. 3, although the first adhesive layer 110 is depicted as being heated through the carrier 200, i.e., heated by conduction, the thermal energy 940 may also be radiated into the exposed surface of the first adhesive layer 110. Thermal energy may also be provided to the first adhesive layer 110 by convection.

Radiant thermal energy 940 may be provided to the first adhesive layer 110 by an infrared lamp. As the first adhesive layer 110 is cured thermally, a "first cured" first adhesive layer 110C may be formed. The uncured first adhesive layer 110 may be a viscous liquid. After curing, however, the cured first adhesive layer 110C may be solid or may have a much greater viscosity similar to glass.

Figure 4:
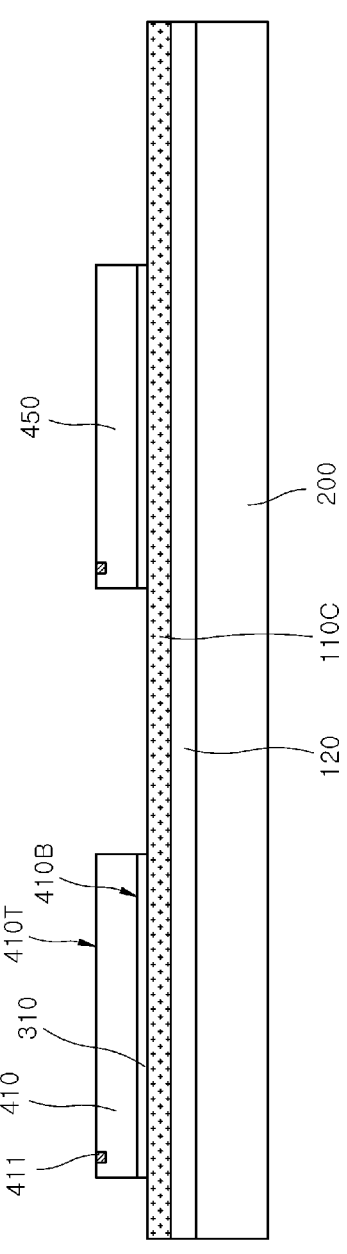
FIG. 4 is a cross-sectional view illustrating arranging a first semiconductor die in the method of manufacturing a semiconductor package according to an embodiment of the present disclosure.

FIG. 4 illustrates arranging a first semiconductor die 410 in the method of manufacturing a semiconductor package according to an embodiment of the present disclosure.

Referring to FIG. 4, the first semiconductor die 410 may be located on the cured first adhesive layer 110C. The first semiconductor die 410 may be attached to the cured first adhesive layer 110C by a third adhesive layer 310. The third adhesive layer 310 may be a die attach film (DAF) or a wafer back lamination (WBL) tape. Because the cured first adhesive layer 110C is a hard layer that does not substantially flow, it is possible to reduce or suppress the occurrence of positional defects in which the attached first semiconductor die 410 undesirably shifts or rotates.

The first semiconductor die 410 may be a device in which integrated circuits (ICs) are integrated on a semiconductor substrate. The integrated circuits may include memory elements such as dynamic random access memory (DRAM), static random access memory (SRAM), NAND-type flash memory, NOR-type flash memory, magnetic random access memory (MRAM), resistive random access memory (Re-RAM), ferroelectric random access memory (FeRAM), or phase change random access memory (PCRAM). Alternatively, the integrated circuits may constitute a logic circuit, an application processor (AP), a graphic processing unit (GPU), or a central processing unit (CPU).

The first semiconductor die 410 may include a first connecting terminal 411 or first connecting terminals 411 on a first surface 410T. The first connecting terminal 411 may be formed in a shape of a conductive pattern or a conductive pad. The first connecting terminal 411 may be electrically and signally connected to the integrated circuits integrated in the first semiconductor die 410. The first semiconductor die 410 may be located over the carrier 200 such that a second surface 410B of the first semiconductor die 410 is bonded to the third adhesive layer 310. The second surface 410B may be a surface opposite to the first surface 410T where the first connecting terminal 411 is disposed.

A fifth semiconductor die 450 may be located over the carrier 200 at a position spaced apart from the first semiconductor die 410. The fifth semiconductor die 450 may be laterally spaced apart from the first semiconductor die 410. The fifth semiconductor die 450 may be substantially the same as the first semiconductor die 410.

Figure 5:
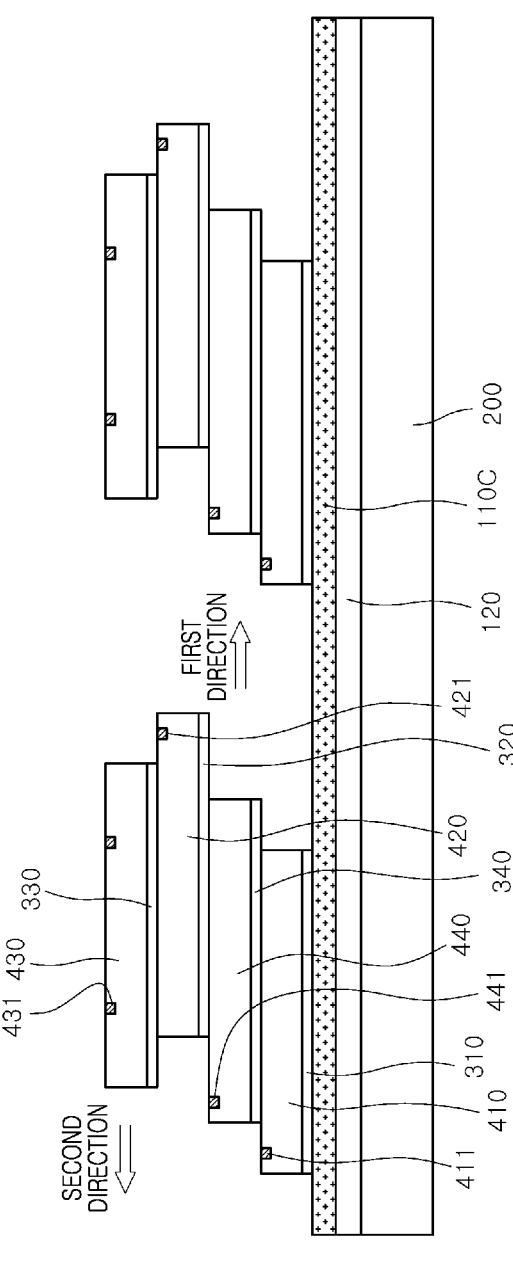
FIG. 5 is a cross-sectional view illustrating stacking a second semiconductor die on the first semiconductor die in the method of manufacturing a semiconductor package according to an embodiment of the present disclosure.

FIG. 5 illustrates stacking a second semiconductor die 420 on the first semiconductor die 410 in the method of manufacturing a semiconductor package according to an embodiment of the present disclosure.

Referring to FIG. 5, the second semiconductor die 420 may be stacked over the first semiconductor die 410. The second semiconductor die 420 may be stacked with a first off-set over the first semiconductor die 410 such that a portion of the second semiconductor die 420 protrudes from the first semiconductor die 410 in a first direction. A third semiconductor die 430 may be stacked with a second off-set over the second semiconductor die 420 such that a portion of the third semiconductor die 430 protrudes from the second semiconductor die 420 in a second direction opposite to the first direction. In addition, a fourth semiconductor die 440 may be located between the first semiconductor die 410 and the second semiconductor die 420. The fourth semiconductor die 440 may be located over the first semiconductor die 410 such that a portion of the fourth semiconductor die 440 protrudes from the first semiconductor die 410 in the first direction. The fourth semiconductor die 440 may be stacked over the first semiconductor die 410 with a third off-set in the first direction.

The fourth semiconductor die 440 may be attached to the first semiconductor die 410 by a sixth adhesive layer 340. The sixth adhesive layer 340 may be a DAF or a WBL tape. The second semiconductor die 420 may be attached to the fourth semiconductor die 440 by a fourth adhesive layer 320. The fourth adhesive layer 320 may be a DAF or a WBL tape. The third semiconductor die 430 may be attached to the second semiconductor die 420 by a fifth adhesive layer 330. The fifth adhesive layer 330 may be a DAF or a WBL tape.

The fourth semiconductor die 440 may be located over the first semiconductor die 410 to expose the first connecting terminal 411 of the first semiconductor die 410. The second semiconductor die 420 may be located over the fourth semiconductor die 440 to expose a fourth connecting terminal 441 of the fourth semiconductor die 440. The second semiconductor die 420 may be located over the fourth semiconductor die 440 to expose the connecting terminal 411 of the first semiconductor die 410. The third semiconductor die 430 may be located over the second semiconductor die 420 to expose a second connecting terminal 421 of the second semiconductor die 420. The third semiconductor die 430 may include a third connecting terminal 431. Similarly, semiconductor dies may also be stacked over the fifth semiconductor die (450 in FIG. 4).

Because the third semiconductor die 430 is stacked with the second off-set in the second direction that is opposite to the off-set directions of the underlaying second and fourth semiconductor dies 420 and 440, it is possible to reduce a width of the stack structure in which the semiconductor dies 410, 440, 420, and 430 are stacked.

Figure 6:
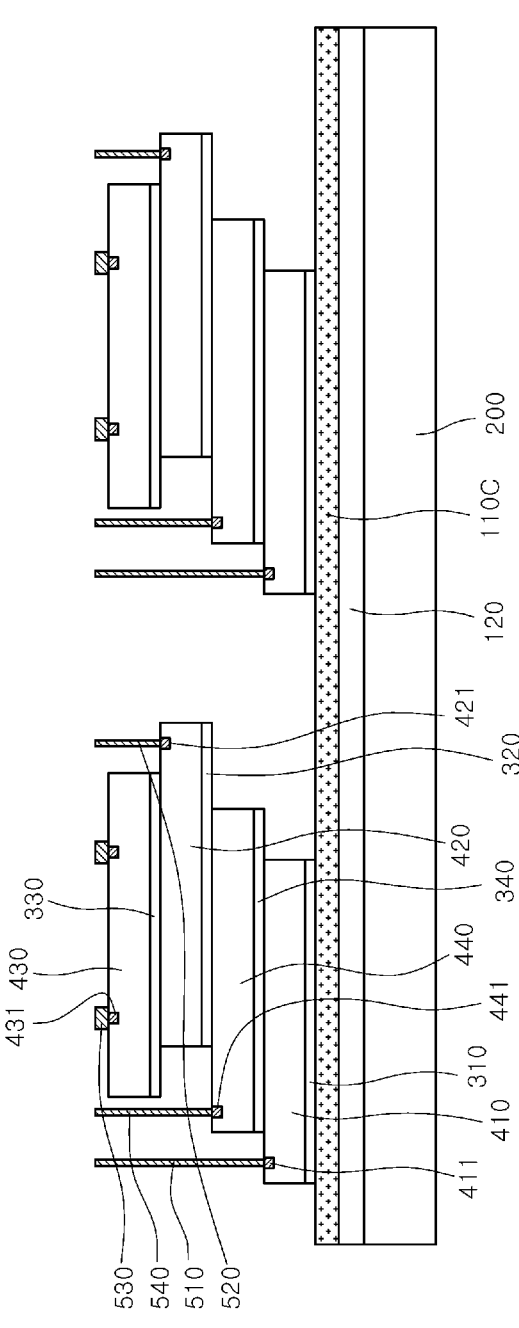
FIG. 6 is a cross-sectional view illustrating forming vertical connectors in the method of manufacturing a semiconductor package according to an embodiment of the present disclosure.

FIG. 6 illustrates forming vertical connectors 510, 520, and 540 in the method of manufacturing a semiconductor package according to an embodiment of the present disclosure.

Referring to FIG. 6, the first vertical connector 510 may be connected to the first semiconductor die 410. The second vertical connector 520 may be connected to the second semiconductor die 420. Connectors such as conductive bumps 530 may be connected to the third semiconductor die 430. The third vertical connector 540 may be connected to the fourth semiconductor die 440. The first vertical connector 510 may be formed as a bonding wire that has one end coupled to the first connecting terminal 411 of the first semiconductor die 410 and vertically extends from the one end. The second and third vertical connectors 520 and 540 may also be formed as bonding wires. The bonding wires may be formed by a wire bonding process.

Each of the vertical connectors 510, 520, and 540 may include a conductive metal material such as gold (Au) or copper (Cu). The conductive bump 530 may include a conductive metal material such as copper (Cu). The vertical connectors 510, 520, and 540 and the conductive bumps 530 may be formed as interconnection members that extend substantially vertically or stand substantially vertically from the semiconductor dies 410, 420, 440, and 430, respectively. The vertical connectors 510, 520, and 540 and the conductive bumps 530 may provide paths through which electrical signals are connected to the semiconductor dies 410, 420, 440, and 430, respectively.

Figure 7:
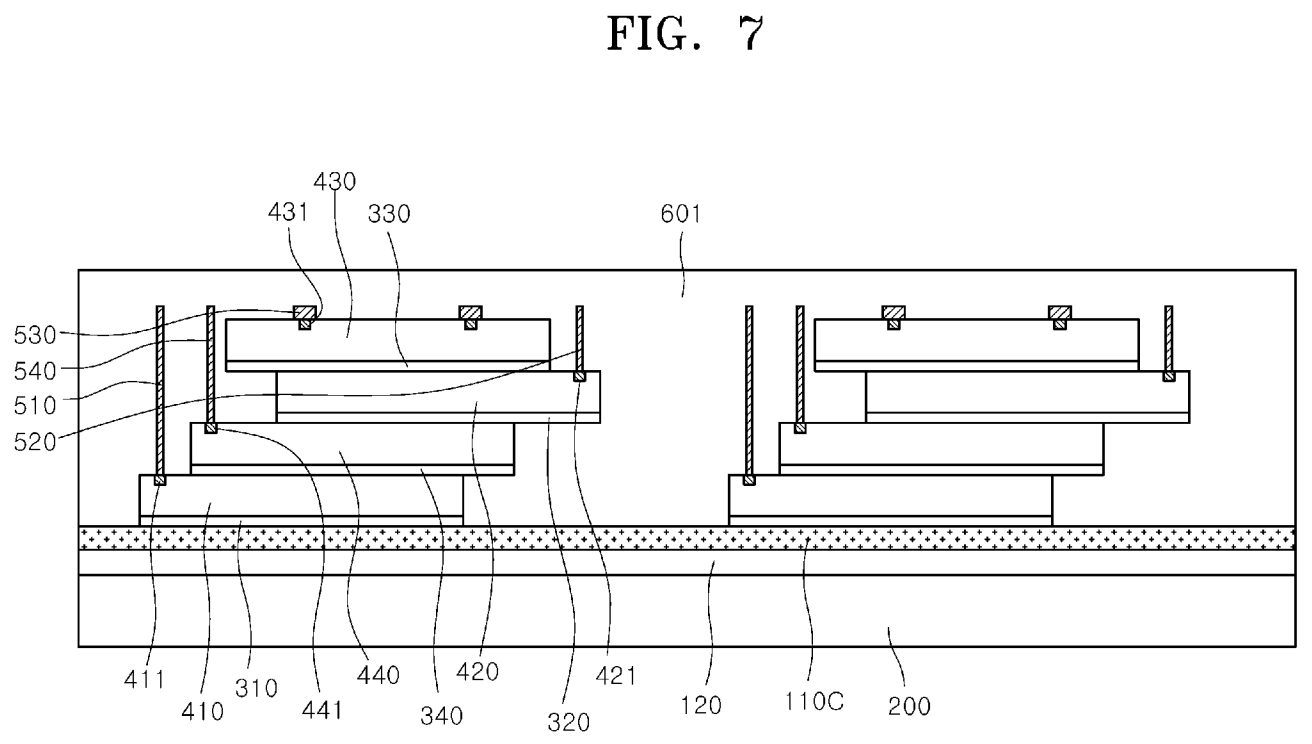

FIG. 7 illustrates forming an encapsulation layer 601 in the method of manufacturing a semiconductor package according to an embodiment of the present disclosure.

Referring to FIG. 7, the encapsulant layer 601 may be formed. The encapsulant layer 601 may be formed to be coupled to a portion of the cured first adhesive layer 110C while encapsulating the first semiconductor die 410. The encapsulant layer 601 may be formed to enclose the first semiconductor die 410 or cover a portion of the first semiconductor die 410 to encapsulate the first semiconductor die 410. The encapsulant layer 601 may be formed to further encapsulate the second semiconductor die 420, the third semiconductor die 430, and the fourth semiconductor die 440. The encapsulant layer 601 may be formed to enclose or cover the first vertical connector 510 to encapsulate the first vertical connector 510. The encapsulant layer 601 may be formed to enclose or cover the second and third vertical connectors 520 and 540 and the conductive bumps 530 to encapsulate the second and third vertical connectors 520 and 540 and the conductive bumps 530.

The encapsulant layer 601 may be formed by a molding process using a liquid encapsulant material. The encapsulant layer 601 may be molded using a liquid epoxy molding compound (EMC). Both the encapsulant layer 601 and the cured first adhesive layer 110C may be formed of an epoxy molding compound (EMC).

Figure 8:
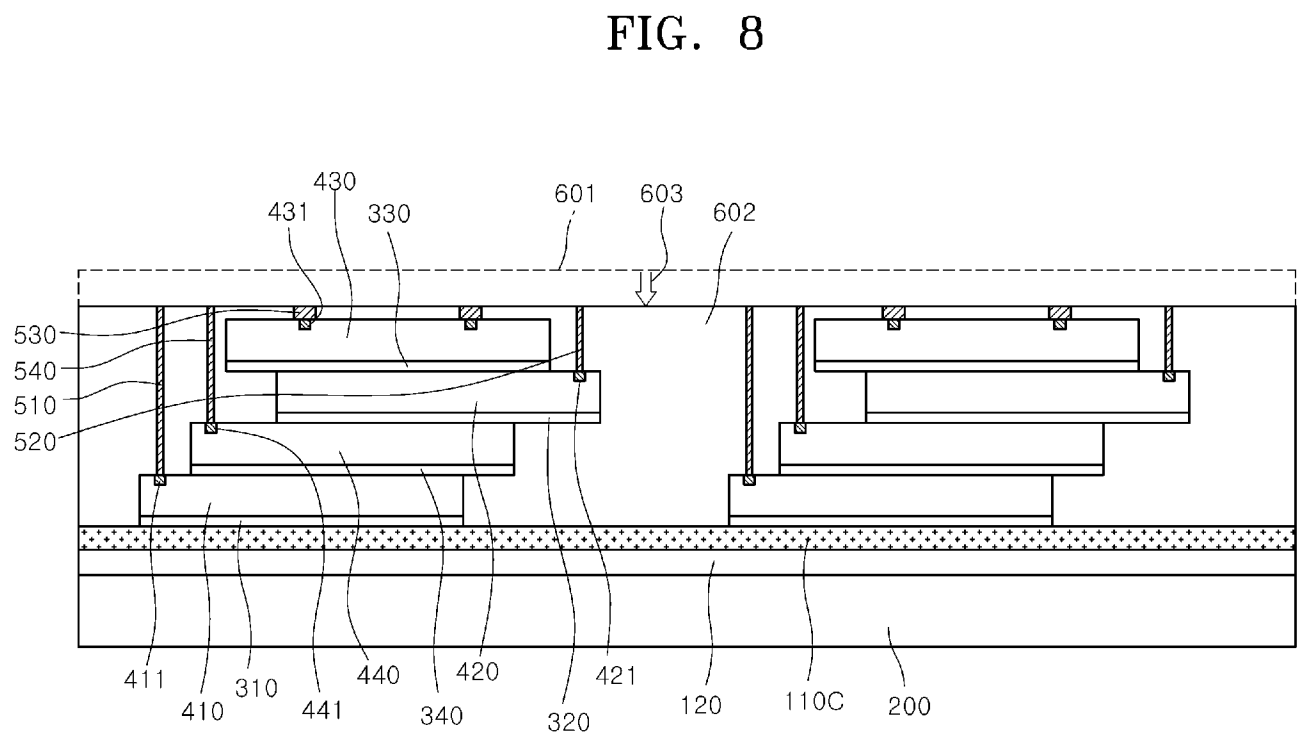

FIG. 8 illustrates removing 603 a portion of the encapsulation layer 601 in the method of manufacturing a semiconductor package according to an embodiment of the present disclosure.

Referring to FIG. 8, the portion of the encapsulant layer 601 may be removed by grinding the encapsulant layer 601. The portion of the encapsulant layer 601 may be removed to expose portions (or some surfaces) of the vertical connectors 510, 520, and 540 and the conductive bumps 530.

Figure 9:
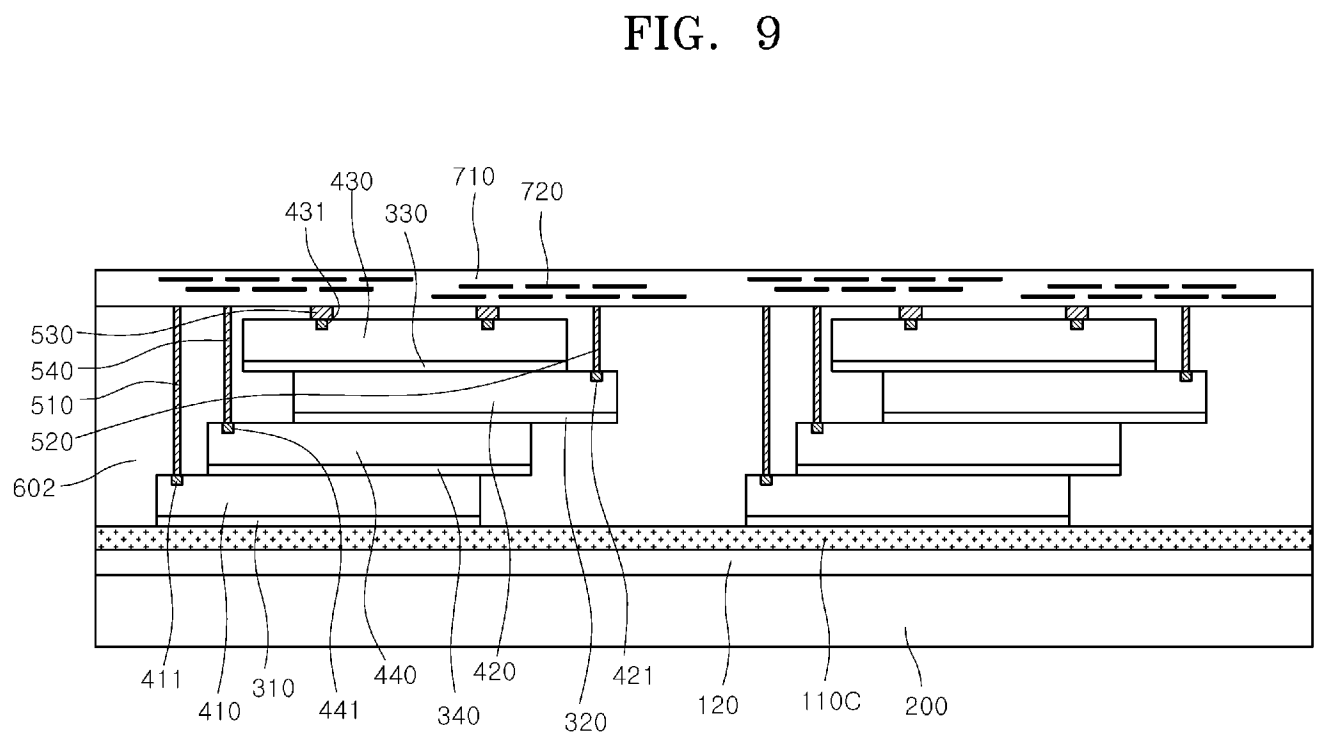

FIG. 9 illustrates forming redistribution layers 720 in the method of manufacturing a semiconductor package according to an embodiment of the present disclosure.

Referring to FIG. 9, redistribution layers 720 may be formed over the encapsulant layer 602. Some of the redistribution layers 720 may be electrically connected to the first semiconductor die 410. The redistribution layers 720 may be formed as conductive patterns electrically and signally connected to the vertical connectors 510, 520, and 540 and the conductive bumps 530. The redistribution layers 720 may be formed as circuit wirings connected to the semiconductor dies 410, 420, 430, and 440 through the vertical connectors 510, 520, and 540 and the conductive bumps 530. The redistribution layers 720 may be insulated from each other by a dielectric layer 710. The redistribution layers 720 may be an interconnection structure connected to the semiconductor dies 410, 420, 430, and 440. The redistribution layers 720 may provide an interconnection structure that is thinner than a printed circuit board (PCB).

Figure 10:
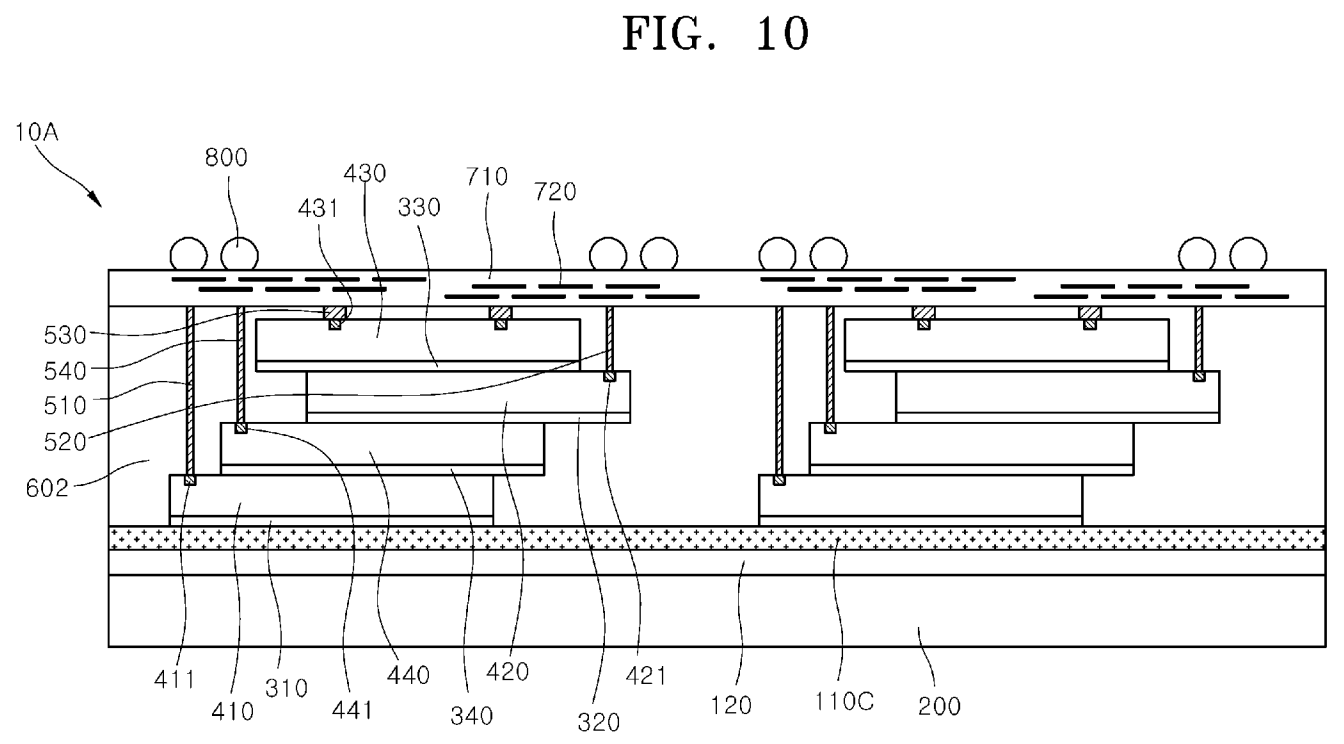

FIG. 10 illustrates forming outer terminals 800 in the method of manufacturing a semiconductor package according to an embodiment of the present disclosure.

Referring to FIG. 10, outer terminals 800 electrically connected to the redistribution layers 720 may be formed. The outer terminals 800 may be formed as conductive connectors such as solder balls. As such, a package structure 10A including the second adhesive layer 120, the cured first adhesive layer 110C, the semiconductor dies 410, 420, 430, and 440, the encapsulant layer 602, the redistribution layers 720, and the outer terminals 800 may be formed on the carrier 200.

Figure 11:
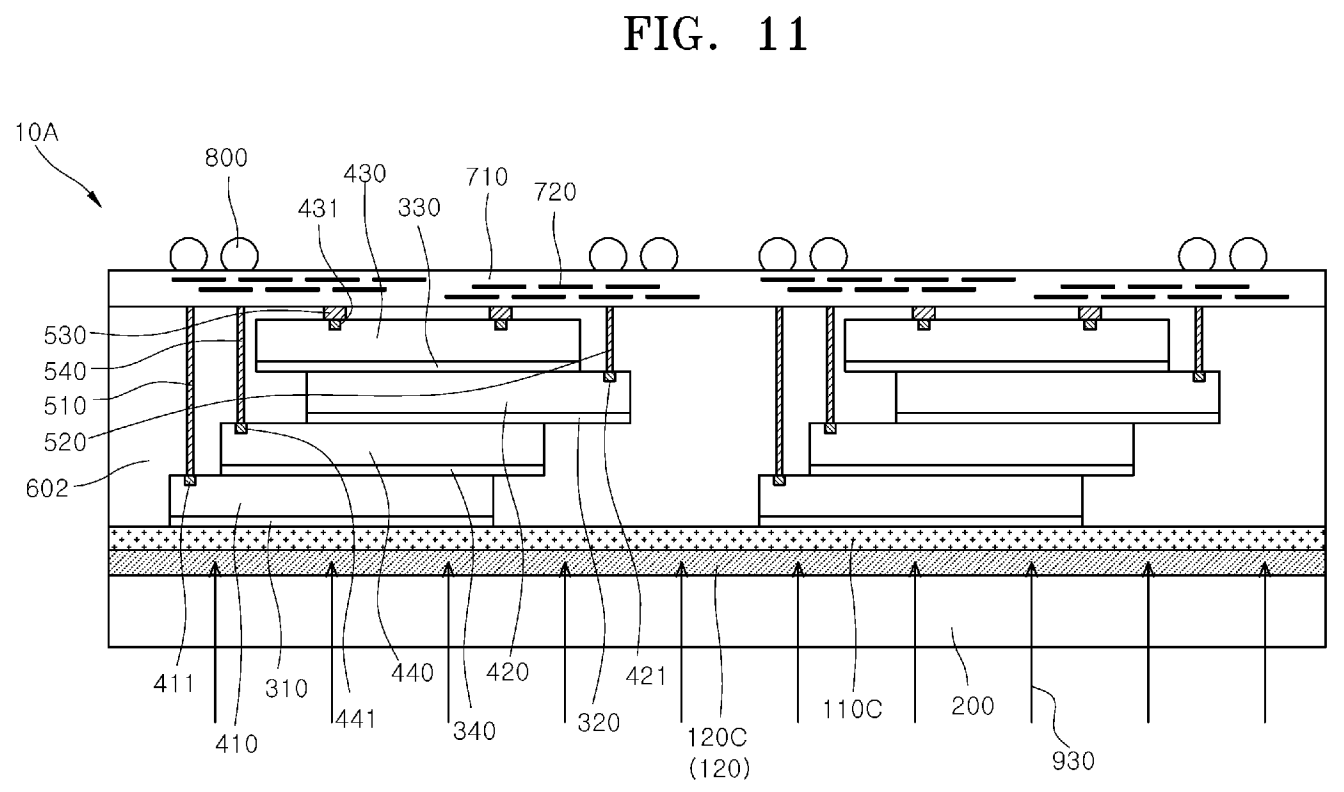

FIG. 11 illustrates the "second curing" of the second adhesive layer, i.e., the curing of the second adhesive layer 120 after curing the first adhesive layer 110, in the method of manufacturing a semiconductor package according to an embodiment of the present disclosure.

Referring to FIG. 11, the second adhesive layer 120 may be cured after the first adhesive layer 110 is cured, thereby forming a "second cured," second adhesive layer 120C. Light 930 required for curing may be irradiated from a light source (or UV source) onto the photocurable adhesive of the second adhesive layer 120. The light 930 for curing may include ultraviolet (UV) light. The ultraviolet rays may be irradiated to the second adhesive layer 120 by a UV laser. The adhesive bond strength of the "second cured" second adhesive layer 120C to the carrier 200 may be lower than the bond strength of the second adhesive layer 120 to the carrier 200 before curing.

Figure 12:
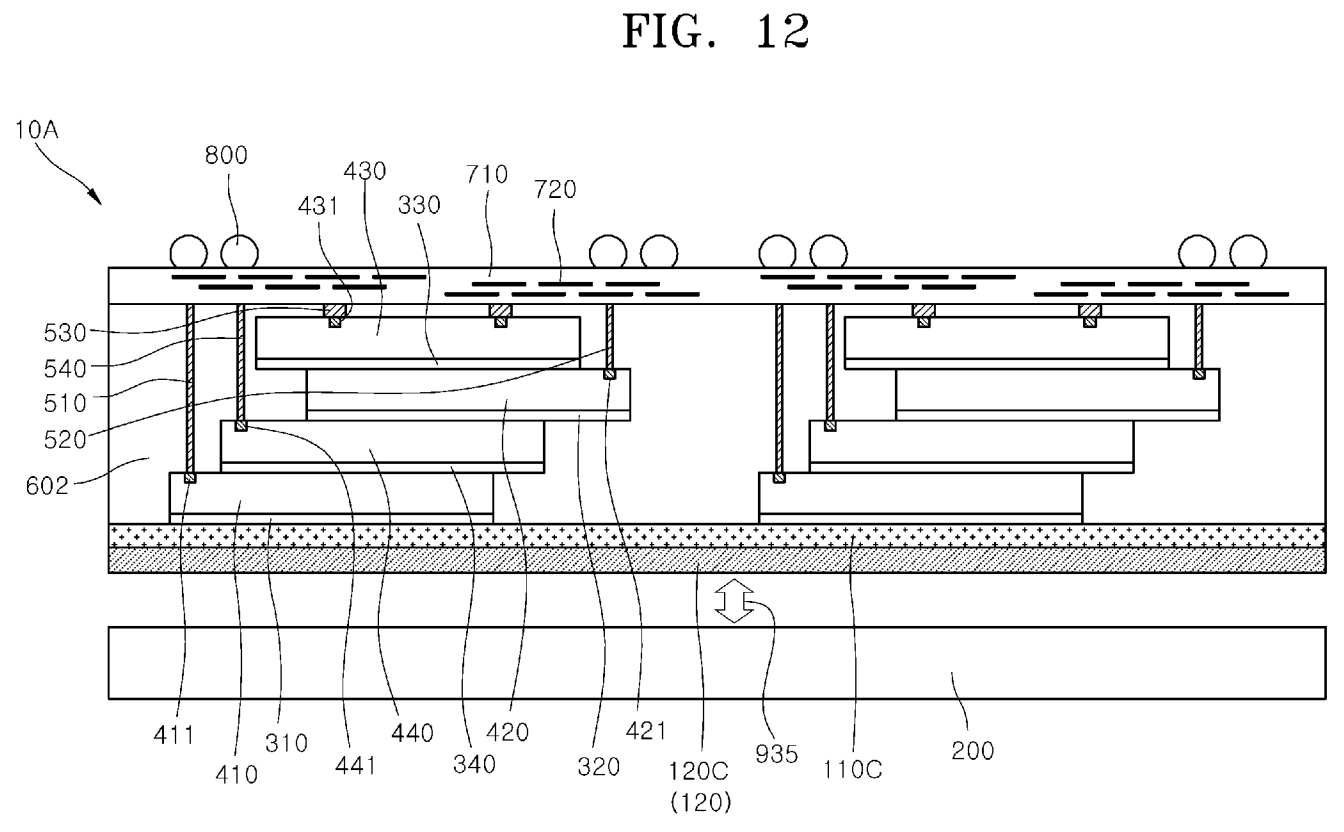

FIG. 12 illustrates separating the carrier 200 in the method of manufacturing a semiconductor package according to an embodiment of the present disclosure.

Referring to FIG. 12, the carrier 200 is considered detachable because it may be separated 935 from the cured second adhesive layer 120C. The cured second adhesive layer 120C may be in a state in which adhesive strength of the bond to the carrier 200 provided by the cured second adhesive layer 120C is lowered or in a state in which the adhesive bonding strength is reduce or even lost. Accordingly, the carrier 200 may be relatively easily separated or detached from the cured second adhesive layer 120C. In addition, the residue remaining on the carrier 200 may be reduced or inhibited. Accordingly, when cleaning the carrier 200, cleaning intensity may be reduced. Damage to the carrier 200 due to the cleaning process may be reduced.

A laser marking process may be performed on the cured first adhesive layer 110C and/or the cured second adhesive layer 120C of the package structure 10A separated from the carrier 200.

Figure 13:
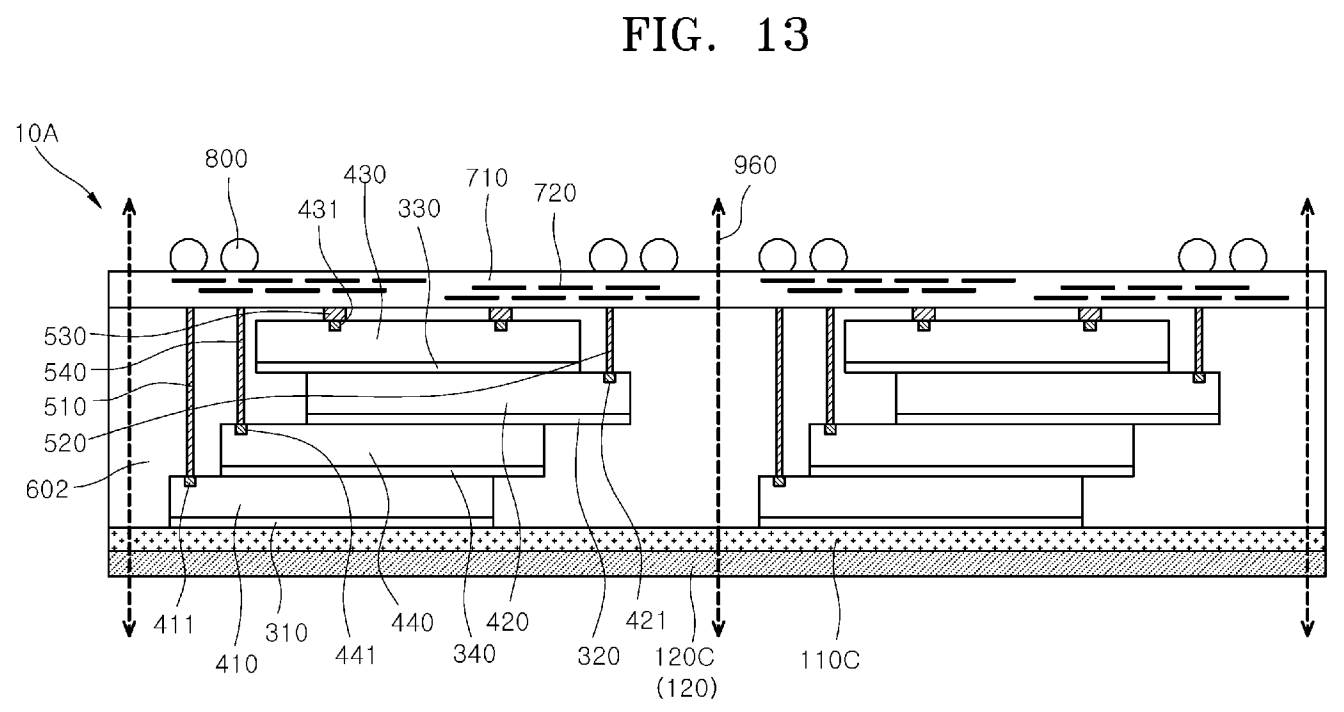
Figure 14:
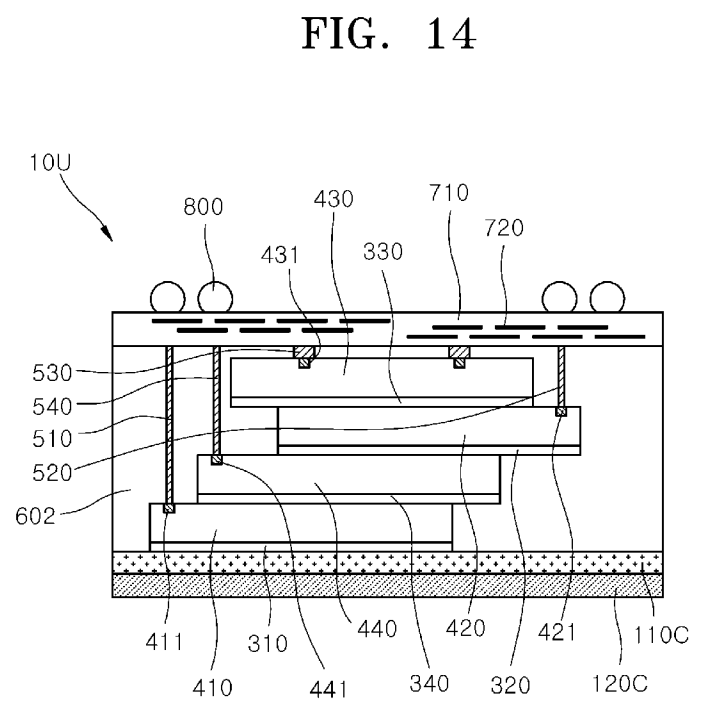

FIGS. 13 and 14 illustrate dicing a wafer into single semiconductor packages in the method of manufacturing a semiconductor package according to an embodiment of the present disclosure.

Referring to FIGS. 13 and 14, the package structure 10A may be diced along dicing lines 960, so that single semiconductor packages 10U may be separated from the package structure 10A. In the dicing process, portions of the dielectric layer 710, the encapsulant layer 602, the cured first adhesive layer 110C, and the second cured second adhesive layer 120C may be removed using a sawing blade (not shown).

As shown in FIG. 3, the cured first adhesive layer 110C may serve as a supporting base during the packaging process shown in FIGS. 4 to 11. When the first semiconductor die is located on the uncured first adhesive layer (110 in FIG. 2) and the encapsulant layer is formed, the uncured first adhesive layer 110 may be deformed or flowed by the molding pressure to form the encapsulant layer. Accordingly, the position of the first semiconductor die located on the uncured first adhesive layer (110 in FIG. 2) may be changed. However, because the cured first adhesive layer 110C is a cured layer and is in a hard state, the cured first adhesive layer 110C can resist being deformed despite the molding pressure to form the encapsulant layer (602 in FIG. 7). Accordingly, an unwanted shift or rotation of the first semiconductor die 410 located on the cured first adhesive layer 110C may be reduced or suppressed.

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A method of manufacturing a semiconductor package, the method comprising:
 laminating an adhesive sheet comprising first and second adhesive layers, to a carrier, wherein the second adhesive layer being coupled to the carrier;
 curing the first adhesive layer to produce a cured first adhesive layer;
 arranging a first semiconductor die on the cured first adhesive layer;
 forming an encapsulant layer on a portion of the first cured first adhesive layer, while encapsulating the first semiconductor die;
 curing the second adhesive layer to produce a cured second adhesive layer; and
 separating the carrier from the cured second adhesive layer, wherein the cured second adhesive layer has an adhesive strength less than an adhesive strength of the second adhesive layer before curing, while the second adhesive layer curing.

2. The method of claim 1,
 wherein the first adhesive layer comprises a thermosetting adhesive, and
 wherein the second adhesive layer comprises a photocurable adhesive.

3. The method of claim 2, wherein the first adhesive layer further comprises a filler.

4. The method of claim 3, wherein the first adhesive layer further comprises a colorant.

5. The method of claim 2, wherein the second adhesive layer further comprises a filler.

6. The method of claim 5, wherein the second adhesive layer further comprises a colorant.

7. The method of claim 2, wherein the step of curing the first adhesive layer comprises heating the thermosetting adhesive and the photocurable adhesive.

8. The method of claim 2, wherein the step of curing the second adhesive layer comprises irradiating light for curing to the photocurable adhesive.

9. The method of claim 8, wherein the light for curing comprises ultraviolet (UV).

10. The method of claim 1, further comprising forming redistribution layers electrically connected to the first semiconductor die over the encapsulant layer.

11. The method of claim 10, further comprising forming outer terminals electrically connected to the redistribution layers.

12. The method of claim 1, further comprising forming a vertical connector, which is connected to the first semiconductor die before forming the encapsulant layer.

13. The method of claim 12, wherein the vertical connector is formed as a bonding wire that has one end coupled to the first semiconductor die and extends substantially vertically from the one end.

14. The method of claim 12, wherein the encapsulant layer is formed to substantially encapsulate the vertical connector.

15. The method of claim 1, further comprising stacking a second semiconductor die over the first semiconductor die before forming the encapsulant layer.

16. The method of claim 15, wherein the second semiconductor die is stacked over the first semiconductor die with a first off-set, a portion of the second semiconductor die protruding from the first semiconductor die in a first direction.

17. The method of claim 16, further comprising stacking a third semiconductor die over the second semiconductor die with a second off-set, a portion of the third semiconductor die protruding from the second semiconductor die in a second direction opposite to the first direction.

18. The method of claim 17, wherein the first semiconductor die is attached to the cured first adhesive layer by a third adhesive layer.

19. A method of manufacturing a semiconductor package, the method comprising:
 forming first and second adhesive layers on a carrier;
 first curing the first adhesive layer to produce a cured first adhesive layer;
 arranging a first semiconductor die on the cured first adhesive layer;
 forming an encapsulant layer on a portion of the cured first adhesive layer while encapsulating the first semiconductor die;
 curing the second adhesive layer to produce a cured second adhesive layer; and separating the carrier from the cured second adhesive layer, wherein the cured second adhesive layer has an adhesive strength less than an adhesive strength of the second adhesive layer before curing, while the second adhesive layer curing.

* * * * *